United States Patent
Franzen et al.

(10) Patent No.: US 9,766,607 B2
(45) Date of Patent: *Sep. 19, 2017

(54) TEST DEVICE FOR TESTING A VIRTUAL ELECTRONIC CONTROL UNIT

(71) Applicant: dSPACE digital signal processing and control engineering GmbH, Paderborn (DE)

(72) Inventors: Ortwin Ludger Franzen, Bad Lippspringe (DE); Karsten Kruegel, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 612 days.

This patent is subject to a terminal disclaimer.

(21) Appl. No.: 14/270,782

(22) Filed: May 6, 2014

(65) Prior Publication Data

US 2014/0330405 A1 Nov. 6, 2014

Related U.S. Application Data

(60) Provisional application No. 61/819,826, filed on May 6, 2013.

(30) Foreign Application Priority Data

May 6, 2013 (EP) ..................................... 13166604

(51) Int. Cl.
*G05B 17/02* (2006.01)
*G06F 17/50* (2006.01)
(Continued)

(52) U.S. Cl.
CPC ............. *G05B 17/02* (2013.01); *G05B 15/02* (2013.01); *G05B 23/02* (2013.01); *G06F 17/5009* (2013.01)

(58) Field of Classification Search
None
See application file for complete search history.

(56) References Cited

U.S. PATENT DOCUMENTS

2008/0147209 A1 6/2008 Landgraf
2009/0240477 A1 9/2009 Higuchi et al.
(Continued)

FOREIGN PATENT DOCUMENTS

CN 102023922 B 9/2012
DE 38 39 211 A1 5/1990
(Continued)

OTHER PUBLICATIONS

European Search Report for European Application No. 14153755.5 dated Aug. 13, 2014 with English translation.
(Continued)

*Primary Examiner* — Qing Wu
(74) *Attorney, Agent, or Firm* — Muncy, Geissler, Olds & Lowe, P.C.

(57) ABSTRACT

A test device for testing at least a portion of a virtual electronic control unit with a simulation environment in a simulator, having the virtual electronic control unit and the simulation environment. The virtual electronic control unit has a software component with an external data interface. The simulation environment has a data interface for direct data exchange with the virtual electronic control unit. A test device with reduced adaptation effort is implemented via a virtual electronic control unit pin module that has at least one virtual electronic control unit interface and is connected via the virtual electronic control unit interface to the external data interface of the software component of the virtual electronic control unit.

13 Claims, 6 Drawing Sheets

(51) Int. Cl.
*G05B 23/02* (2006.01)
*G05B 15/02* (2006.01)

(56) References Cited

U.S. PATENT DOCUMENTS

| | | |
|---|---|---|
| 2010/0100365 A1 | 4/2010 | Moriyama |
| 2012/0143518 A1 | 6/2012 | Kim et al. |
| 2012/0232869 A1 | 9/2012 | Maturana et al. |

FOREIGN PATENT DOCUMENTS

| | | |
|---|---|---|
| EP | 1 291 742 A2 | 3/2003 |
| EP | 1 933 214 A2 | 6/2008 |
| JP | 2008-269022 A | 11/2008 |
| JP | 2011-123676 A | 6/2011 |

OTHER PUBLICATIONS

Thanagasundram et al., "Reconfigurable Hardware-in-the-Loop Simulator," XP055133639, at http://www.researchgate.net/profile/Suguna Thanagasundram/publication/Reconfigurable hardware in the loop Simulator/file/9fcfa506cf189813d6d.pdf, pp. 273-277 (Nov. 30, 2010).
Virtual ECUs as a Basis for an earlier Validation Strategy; Dr. Karsten Krügel, Dr. Klaus Lamberg dSPACE GmbH; IBS-Workshop Automotive Software Engineering; Dresden, Feb. 1, 2011.
V-ECU Implementation Inter-face Design Documentation; CDD[1]; dSPACE GmbH; Ulrich Kiffmeier; Jul. 4, 2012.
V-ECU Implementation Inter-face Design Documentation; CDD[2]; dSPACE GmbH; Ulrich Kiffmeier; Jul. 4, 2012.
Real-Time Implementation Guide; For ConfigurationDesk 4.1; Release 7.2—Nov. 2011; dSPACE GmbH.
AUTOSTAR; Specification of ECU Resource Template; Version 2.2.0; Nov. 8, 2011.
AUTOSTAR; Requirements on I/O Hardware Abstraction; Version 1.1.0; Dec. 7, 2009.
AUTOSTAR; Specification for the ECU Resource Template; Version 1.0.5; Mar. 23, 2011.
AUTOSTAR; Layered Software Architecture; Version 3.2.0; Version Oct. 6, 2011.
SystemDesk V-ECU Generation Module; dSPACE Catalogue 2012.
dSPACE Offline Simulator; dSPACE Catalogue 2012.
English Translation of Japanese Office Action for Japanese Application No. 2014-095805 dated Sep. 28, 2015.
Chinese Office Action for Chinese Application No. 201410087645.3 dated Dec. 20, 2016—English translation.
Chinese Office Action for Chinese Application No. 201410180526.2 dated Dec. 29, 2016—English translation.
Chinese Office Action for Chinese Application No. 201410087645.3 dated Jul. 14, 2017 with English translation.
Chinese Office Action for Chinese Application No. 201410180526.2 dated Jul. 19, 2017 with English translation.
Xiao Hu, "Research on Embedded Software Testing of EPS Through ECU in the Loop Simulations," Masters Thesis, with Engilsh Abstract (Oct. 15, 2012) (Complete).

TEST DEVICE FOR TESTING A VIRTUAL ELECTRONIC CONTROL UNIT

This nonprovisional application claims priority to European Patent Application No. 13166604.2, which was filed in Europe on May 6, 2013, and to U.S. Provisional Application No. 61/819,826, which was filed on May 6, 2013, and which are both herein incorporated by reference.

BACKGROUND OF THE INVENTION

Field of the Invention

The invention relates to a test device for testing at least a portion of a virtual electronic control unit with a simulation environment in a simulator, having the virtual electronic control unit and the simulation environment, wherein the virtual electronic control unit comprises at least one software component with at least one external data interface, wherein the simulation environment comprises at least one data interface for at least indirect data exchange with the virtual electronic control unit.

Description of the Background Art

Nowadays non-virtual, which is to say "real," control units are usually considered to be small computers with an I/O interface (I/O=input/output) that often are equipped with a real-time-capable operating system that allows even complex tasks, mostly feedback control tasks, to be implemented on the control unit. Control unit development is a core part of the technical development of large-scale equipment facilities such as are known from industrial practice. The use of control units in the automotive industry, in the aerospace industry, and in industrial production facilities is cited by way of example.

Testing of the mass produced control unit employed in the end product is the final point of multiple preceding development steps of a closed-loop or open-loop control to be implemented on the control unit, wherein these development steps usually are described with the so-called V-model or else V-cycle. Controller development, which is essential for functionality of many technical systems, starts off with the mathematical modeling of the control algorithm on a computer with a mathematical and graphical modeling environment, wherein the controller should be considered a part of the control unit. In addition, the environment of the control unit is also modeled mathematically, since the interaction of the controller on the control unit with the process to be controlled is of interest. In these functional mathematical considerations, simulation in real time generally is not necessary (offline simulation).

In the next step, the previously developed control algorithm is transferred by Rapid-Control-Prototyping to a powerful hardware unit, usually a hardware unit that is real-time-capable, which is connected to the actual physical process by suitable I/O interfaces, which is to say to a motor vehicle engine, for instance. Generally speaking, this real-time-capable hardware unit has nothing to do with the mass produced control unit that will later be employed; at issue here is proof of the basic functionality in practice of the previously developed control.

In another step, as part of automatic production code generation the control that is likely to actually be employed later in the mass produced control unit is implemented on the target processor. Accordingly, in this step, the target hardware approximates the mass produced control unit, but is not identical to the mass produced control unit. In another step, the mass produced control unit—which normally does not exist until a later development stage—is tested in the framework of a Hardware-in-the-Loop test (HIL). The mass produced control unit physically present in this step is connected by means of its physical control unit interface to a powerful simulator here. The simulator simulates the required variables of the mass produced control unit to be tested, and exchanges input and output variables with the mass produced control unit. The pins of the physical control unit interface of the mass produced control unit are connected to the simulator by a cable harness. In this way, it is possible to simulate all required variables of a motor vehicle engine—if applicable the entire motor vehicle with engine, drive train, chassis, and plant model—and to test the behavior of the mass produced control unit in interaction with the simulation environment in a risk-free manner.

The mass produced control unit tested within the framework of the HIL simulation is ultimately tested in the "real" target system, which is to say, for example, installed in a motor vehicle and tested in the real physical environment that was merely imitated in the simulation environment.

The above-outlined development process in controller development has stood the test of time extremely well. However, the development process involves the circumstance that the mass produced control unit is not incorporated until the very end of development, and thus also is not tested until the late development stages. Before the mass produced control unit is actually available, functionalities can only be tested at an abstract functional level with the indicated development process, which is to say practically only at the level of application software. A significant portion of the software components later employed on the mass produced control unit are not included in testing in early development stages. One of these software components is the runtime environment, for example, which mediates between the application software and the software layers close to the hardware. Examples of software layers close to the hardware include the operating system and platform-independent system software (system services, communication services, I/O hardware abstraction layer, etc.), and lastly, platform-dependent parts of the operating system and system software.

In order to include these extensive parts of the mass produced control unit in the development process early on, the aforementioned software components are—at least partly—reproduced as part of a so-called virtual electronic control unit and are simulated in a simulator (dSPACE Catalog 2012: "SystemDesk V-ECU Generation Module" and "dSPACE Offline Simulator"). In the simulator, the virtual electronic control unit interacts in all cases with the simulation environment that is likewise present in the simulator. The interaction takes place through the exchange of data through the at least one external data interface of a software component of the virtual electronic control unit and a data interface of the simulation environment. Which software components of the virtual electronic control unit provide an external data interface depends on which of the aforementioned software layers are represented in the virtual electronic control unit. If only the abstract application software is represented in the virtual electronic control unit, then the software components of the application software provide the external data interfaces to the simulation environment. In contrast, if the runtime environment is also a component of the virtual electronic control unit, then the external data interfaces are provided by their software components. If still lower software layers are represented, for example the operating system or system software components, then these software components provide the external data interface to the simulation environment.

It is evident that in each case the simulation environment must adapt to the external data interface of the software components of the virtual electronic control unit as a function of the software components reproduced in the virtual electronic control unit. Each change to the virtual electronic control unit that affects a software component with an external data interface also inevitably necessitates a change to the simulation environment and the data interface of the simulation environment, which is labor-intensive and introduces a source of errors in the development process. Another disadvantage is that the simulation environment adapted to a specific virtual electronic control unit as part of the HIL simulation—which is to say when the control unit is no longer present only in virtual form but is actually physically present—oftentimes cannot be used directly, since there is no provision of pin-related variables of the physical control unit at the data interface of the simulation environment that is necessary for such a use.

SUMMARY OF THE INVENTION

It is therefore an object of the present invention to provide a device for testing at least a portion of a virtual electronic control unit with a simulation environment in a simulator in which the dependencies between the virtual electronic control unit and the simulation environment are reduced.

The object derived above is attained in the above-described test device firstly and essentially by the means that a virtual electronic control unit pin module has at least one virtual electronic control unit interface, and is connected by means of the virtual electronic control unit interface at least to the external data interface of the software component of the virtual electronic control unit, that the virtual electronic control unit pin module has at least one simulation environment interface and is connected by the simulation environment interface to the data interface of the simulation environment, and that the virtual electronic control unit pin module has at least one virtual electronic control unit pin that corresponds to a pin of the physical interface of a real control unit to be simulated, wherein a virtual physical control unit signal can be transmitted through the virtual electronic control unit pin.

The virtual electronic control unit pin module provided in accordance with the invention mediates between the virtual electronic control unit and the simulation environment, which makes it possible to leave the simulation environment and its data interface unchanged even when the virtual electronic control unit is changed. Moreover, the additional provision of a virtual electronic control unit pin brings with it the possibility of defining the interface that the real control unit absolutely must also have, namely the virtual representation of the physical interface of the real control unit. This establishes, on the simulator, a pin-related definition and handling of the interface between the virtual electronic control unit and the simulation environment.

The information exchanged through a virtual electronic control unit pin of the virtual electronic control unit pin module is a "virtual physical control unit signal" in that it is not the real physical control unit signals of the actual control unit that is involved here, which is to say voltages, currents, connected resistances, but instead these physical quantities are calculated and the values are exchanged as corresponding data. If only the more abstract software layers are represented in the virtual electronic control unit, for instance the application software or the runtime environment, then the external data interface of the virtual electronic control unit can only be functional in the abstract, but cannot provide a reproduction of the actual control unit in terms of signals. For example, if a pressure value or a temperature value (e.g., 950 bar, 275° C.) is supplied by a component of the application software, but not a corresponding electrically encoded variable that is exchanged in the case of the real control unit through pins of the physical interface, for example in the form of a voltage, in the form of a current (2 to 20 mA interface), or in the form of a modulated signal, the virtual electronic control unit pin module can now close this gap by the means that it transmits precisely such a virtual physical control unit signal, which is to say the value of the corresponding real physical control signal, to at least one virtual electronic control unit pin.

According to an exemplary embodiment, provision is made in the test device that the simulation environment interface of the virtual electronic control unit pin module has at least one virtual electronic control unit pin so that virtual physical control unit signals can also be transmitted through the data interface of the simulation environment. This is especially advantageous because the data interface of the simulation environment is then automatically adapted to the physical control unit signals of the real control unit. The simulation environment thus configured is then also immediately suitable for being operated on an HIL simulator together with a real control unit connected through a physical I/O interface as is customary in HIL simulations.

In a further development of the test device according to an embodiment of the invention, provision is made that the simulation environment interface of the virtual electronic control unit pin module is composed entirely of virtual electronic control unit pins so that exclusively virtual physical control unit signals are transmitted through the data interface of the simulation environment. The advantage of a virtual electronic control unit pin module designed in this way is that the simulation environment can remain unchanged over practically the entire development process, or at any rate does not need to be changed when the external data interface of a software component of the virtual electronic control unit changes. The simulation environment is independent of the closeness of the virtual electronic control unit to the hardware.

In another embodiment of the test device according to the invention, provision is made that the simulation environment interface of the virtual electronic control unit pin module has no virtual electronic control unit pins so that the virtual electronic control unit pin module establishes a direct connection between the virtual electronic control unit and the simulation environment, and the virtual electronic control unit pin module has the at least one virtual electronic control unit pin outside the simulation environment interface. By means of such a virtual electronic control unit pin it is possible to test whether the expected signals are established at a virtual electronic control unit pin, so that a test of the virtual electronic control unit in terms of signals is made possible even if the simulation environment itself does not use the virtual electronic control unit signals.

On the whole, it is evident from the foregoing discussion that mixed forms of the exemplary embodiments are also possible as a matter of course. Thus, for example, virtual electronic control unit pins can be provided both as a part of the simulation environment interface and outside the simulation environment interface.

In an exemplary embodiment of the test device according to the invention, provision is additionally made that the virtual electronic control unit pin module has at least one correspondence between a datum that can be exchanged between the virtual electronic control unit and/or the virtual electronic control unit pin module and/or the simulation environment on the one hand, and the virtual electronic control unit pin that stands in relationship with the determination of this exchangeable datum on the other hand. Because of this correspondence, it is possible in the virtual electronic control unit pin module to ascertain the virtual electronic control unit pins that are meaningful for determining the data to be exchanged as a whole, for example because their associated virtual physical control unit signals are required in order to determine the exchangeable datum. In a further development of the aforementioned test device, provision is made that for each of the virtual electronic control unit pins included in the correspondence, a rule for determining the associated virtual physical control unit signals is also stored in the virtual electronic control unit pin module. As a result, the virtual electronic control unit pin module is made capable of determining the corresponding virtual physical control unit signals, either independently or by initiating the calculation of these virtual physical control unit signals at another location, for example in the simulation environment.

Furthermore, the object derived above is also attained with a virtual electronic control unit pin module for virtual representation of a pin-related physical interface of a real control unit that is to be simulated, wherein the virtual electronic control unit pin module has at least one virtual electronic control unit interface, at least one simulation environment interface, and at least one virtual electronic control unit pin, wherein a data connection to at least one external interface of a software component of a virtual electronic control unit can be established by means of the virtual electronic control unit interface, wherein at least one data connection to the data interface of a simulation environment can be established by means of the simulation environment interface, and wherein the virtual electronic control unit pin corresponds to a pin of the physical interface of a real control unit that is to be simulated, wherein a virtual physical control unit signal can be transmitted through the virtual electronic control unit pin.

The virtual electronic control unit pin module according to an embodiment of the invention is further distinguished by the characteristics that were described above in connection with the test device according to the invention and the virtual electronic control unit pin module implemented there.

In particular, there are now a multiplicity of possibilities for implementing and further developing the test device according to the invention and the virtual electronic control unit pin module according to the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
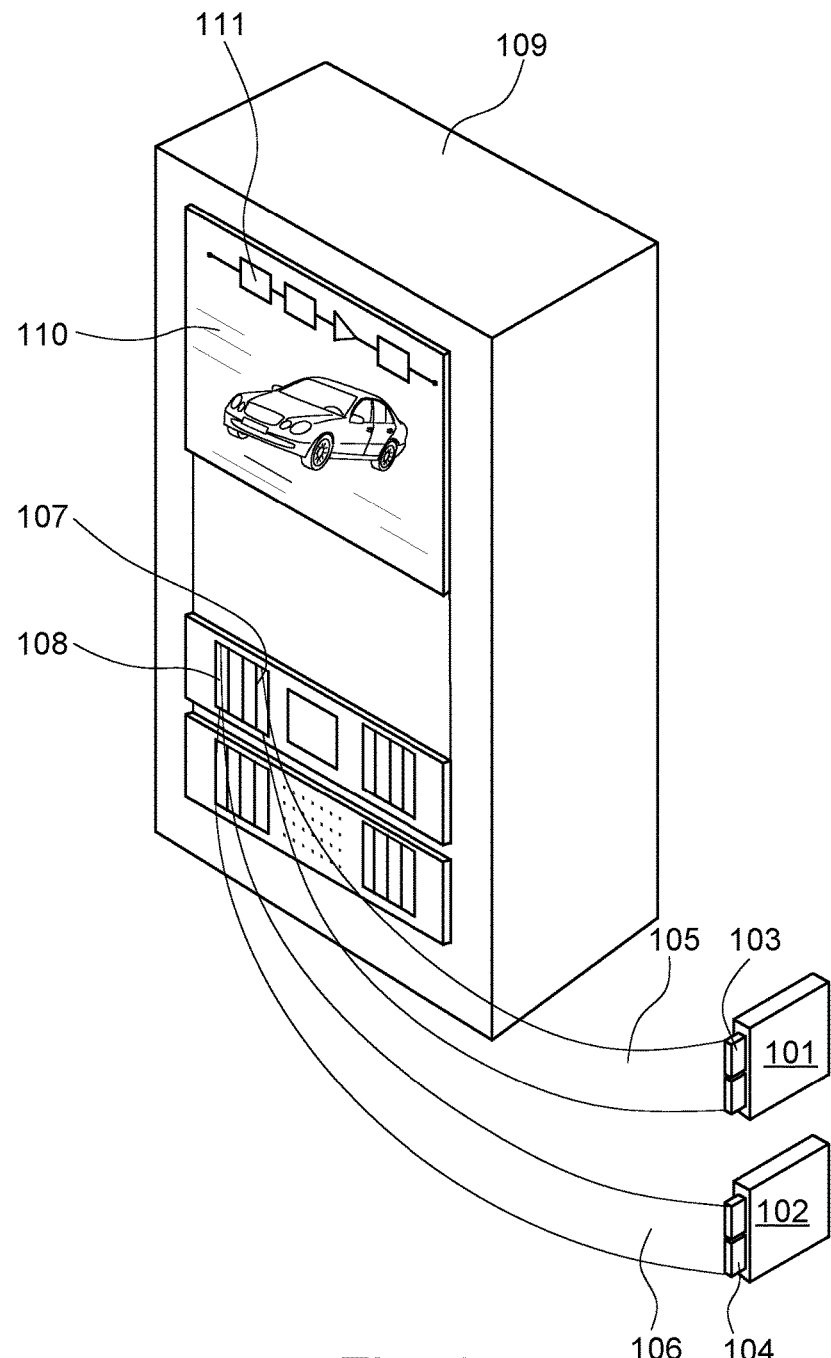
FIG. 1 shows a test setup known from the prior art for testing a real control unit with a simulator.

For the purpose of explaining the test device according to the invention, firstly, FIG. 1 shows a test setup known from the prior art using the principle of the hardware-in-the-loop test. No virtual electronic control units are present in the test setup shown, the real control units 101, 102 are the subjects of the tests. The real control units 101, 102 are connected through their physical interfaces 103, 104 and by cable harnesses 105, 106 to suitable I/O interfaces 107, 108 of a simulator 109. The simulator 109 itself also has, in addition to the I/O interfaces 107, 108, a simulation environment that has as its subject a mathematical motor vehicle model, indicated by the block diagram 111. The test setup shown in FIG. 1 does not come into being until the mass produced control units 101, 102 are on hand at the end of the development process. Until this situation arises, it is not possible to test the software components of the real control units 101, 102 in interaction with the simulator.

Figure 2:
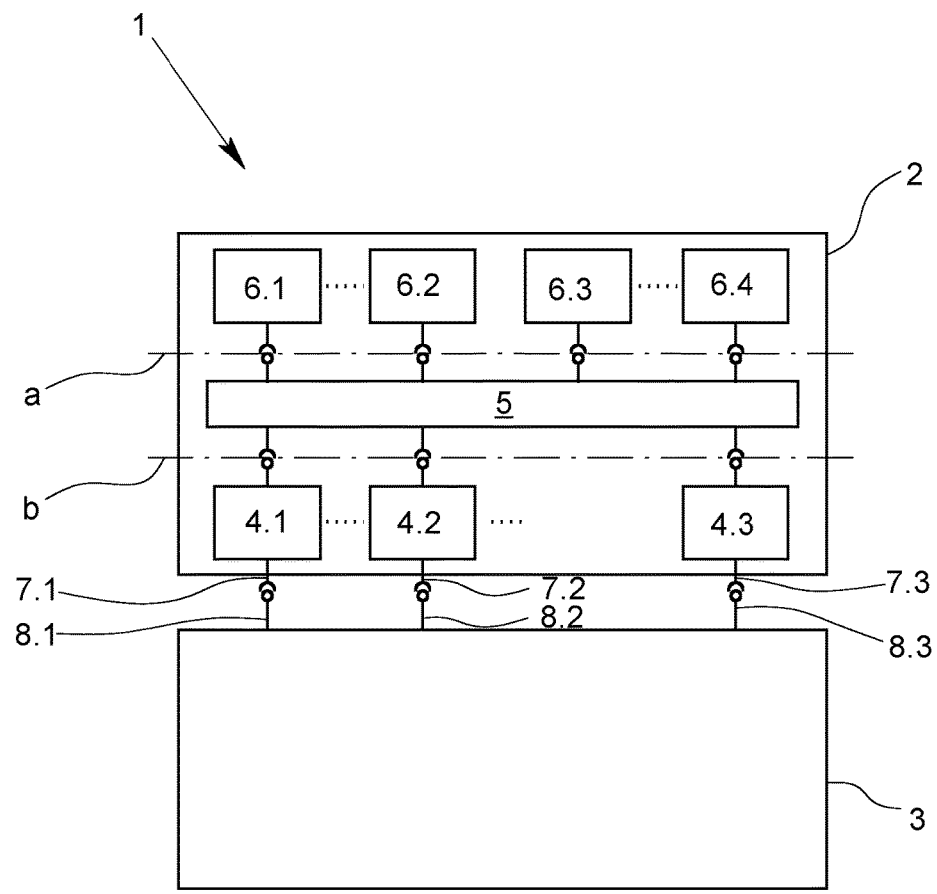
FIG. 2 shows a test setup known from the prior art for testing a virtual electronic control unit with a simulation environment.

In order to allow the components of the software that will later be operated on the real control units 101, 102 [to be tested] in earlier steps of controller development, the test devices 1 shown schematically in FIG. 2 and known from the prior art have been introduced; these devices permit testing of a virtual electronic control unit 2 with a simulation environment 3. Test devices 1 of this nature are operated on a simulator that is not explicitly shown in FIGS. 2 through 6.

The virtual electronic control unit 2 comprises multiple software components 4, 5, 6 that belong to different abstract software layers. The different software layers are indicated in FIG. 2 by horizontal lines a, b. In the exemplary embodiment shown, the software components 6.1, 6.2, 6.3, and 6.4 are components of the application layer, in which software is implemented in a completely machine-independent manner, which is to say independently of the target platform. All software layers below this are closer to the hardware. The software component 5 comprises the runtime environment in the exemplary embodiment shown, and the software components 4.1, 4.2, and 4.3 comprise platform-independent as well as platform-dependent system software, for example in the form of the operating system and in the form of various communication services. The software components 4, 5, 6 are software components that are also intended to be employed later on the real control unit; however, within the framework of a virtual electronic control unit 2, the software components are operated on a simulator that is completely different in terms of equipment from the later real control unit.

The software components 4 stand in connection with the simulation environment 3. To this end, the software components 4 have external data interfaces 7.1, 7.2, and 7.3. Accordingly, the simulation environment has external data interfaces 8.1, 8.2, and 8.3. The virtual electronic control unit 2 shown in FIG. 2 is modeled to very closely approximate the hardware. This is not always the case in practice; in a different modeling of the virtual electronic control unit 2 only the software components 6.1 to 6.4 at the application layer might be present, for example, so that such a virtual electronic control unit would not have the software components 4 and 5. In this case, the interfaces of the software components 6 would be the external data interfaces because they would have to stand in connection with the simulation environment 3 in order to be able to ensure data exchange. It is evident from this example that a change to the virtual electronic control unit 2 in the prior art would necessitate a comprehensive adaptation of the simulation environment 3, which entails corresponding disadvantages: software maintenance, error-prone changes, etc.

Figure 3:
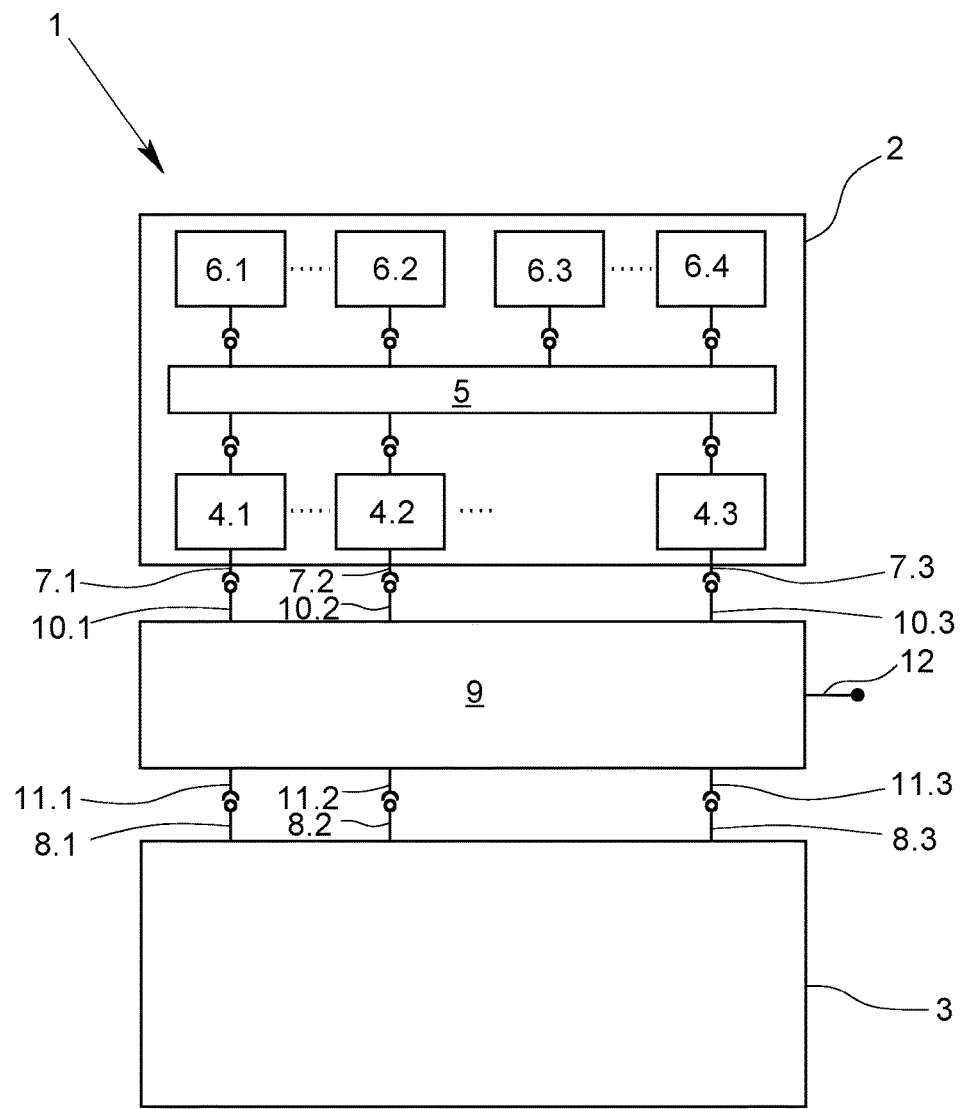
FIG. 3 shows an exemplary embodiment for a test device according to the invention for testing a virtual electronic control unit with a virtual electronic control unit pin module.

FIG. 3 shows a test device 1 according to the invention with a virtual electronic control unit 2 and with a simulation environment 3, wherein a virtual electronic control unit pin module 9 mediating between the virtual electronic control unit 2 and the simulation environment 3 is now provided as well. The virtual electronic control unit pin module 9 has virtual electronic control unit interfaces 10.1, 10.2, 10.3, by means of which the virtual electronic control unit pin module 9 is connected to the external data interfaces 7.1, 7.2, and 7.3 of the software components 4.1, 4.2, 4.3 of the virtual electronic control unit 2. The virtual electronic control unit pin module 9 also has simulation environment interfaces 11.1, 11.2, 11.3, and is connected to the data interfaces 8.1, 8.2, 8.3 of the simulation environment 3 by the simulation environment interfaces 11.1, 11.2, 11.3. Since all of these are components realized on a computer, the interfaces should not be understood as physical, but rather as functional, in the sense that data can be exchanged over the interfaces created.

The virtual electronic control unit pin module 9 also has a virtual electronic control unit pin 12 that corresponds to a pin of the physical interface of a real control unit to be simulated, wherein a virtual physical control unit signal can be transmitted through the virtual electronic control unit pin 12. Thus, the virtual electronic control unit pin 12 emulates a pin of a physical interface of a real control unit. Accordingly, the physical variables that correspond to physical control unit signals of this pin are transmitted in the form of data here. The virtual electronic control unit pin 12 thus allows a view of the virtual electronic control unit 2 that is defined by the physical signal forms of the real physical interface of the real control unit that is to be simulated. For example, if a temperature at the application level of the virtual electronic control unit 2 is to be handled in the form of the specification T=20° C., then this same information is output through a virtual electronic control unit pin 12 as a signal U=2.35 V, for instance. In any case, the virtual electronic control unit pin module 9 makes it possible to obtain a signal view of the virtual electronic control unit 2, wherein this signal view can be used in different ways.

Figure 4:
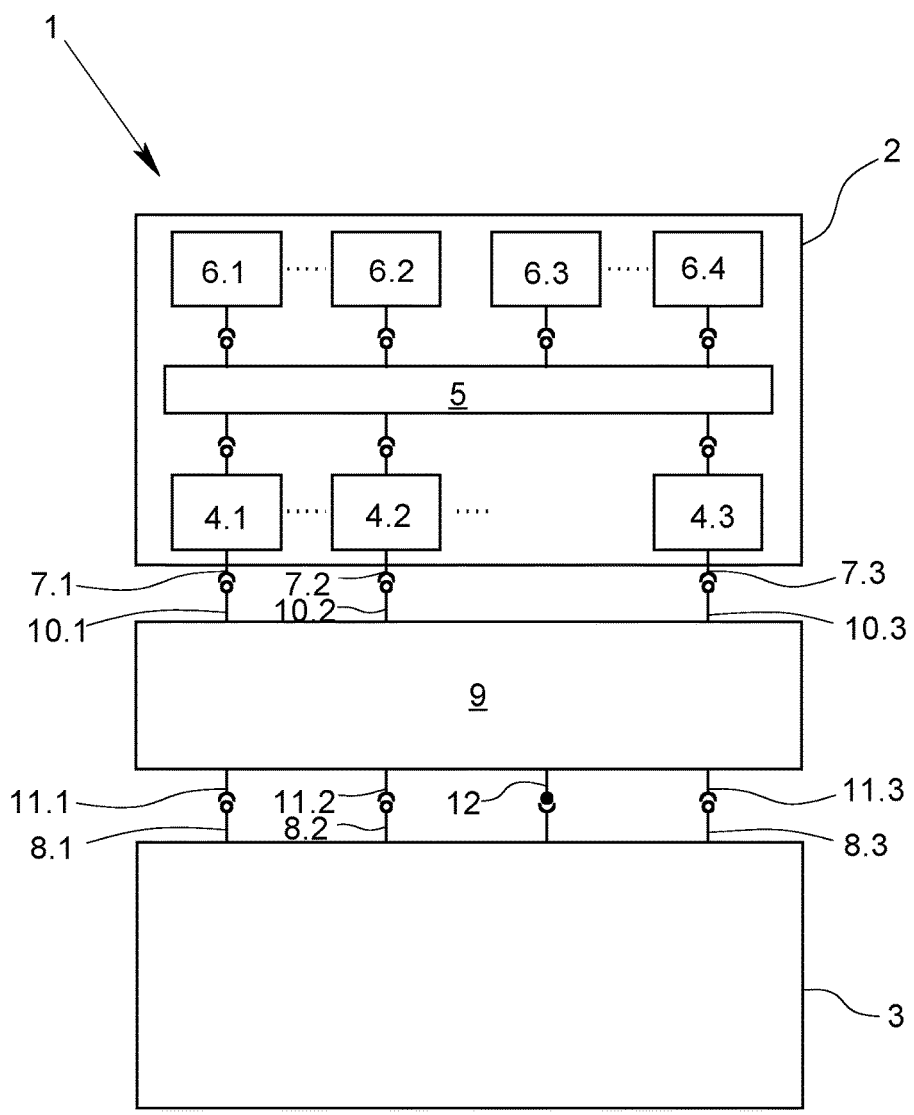
FIG. 4 shows an exemplary embodiment for a test device according to the invention for testing a virtual electronic control unit with a virtual electronic control unit pin module.

In the exemplary embodiment shown in FIG. 4, the simulation environment interface 11 of the virtual electronic control unit pin module 9 includes the virtual electronic control unit pin 12 so that virtual physical control unit signals can also be transmitted through the data interface 8 of the simulation environment 3.

Figure 5:
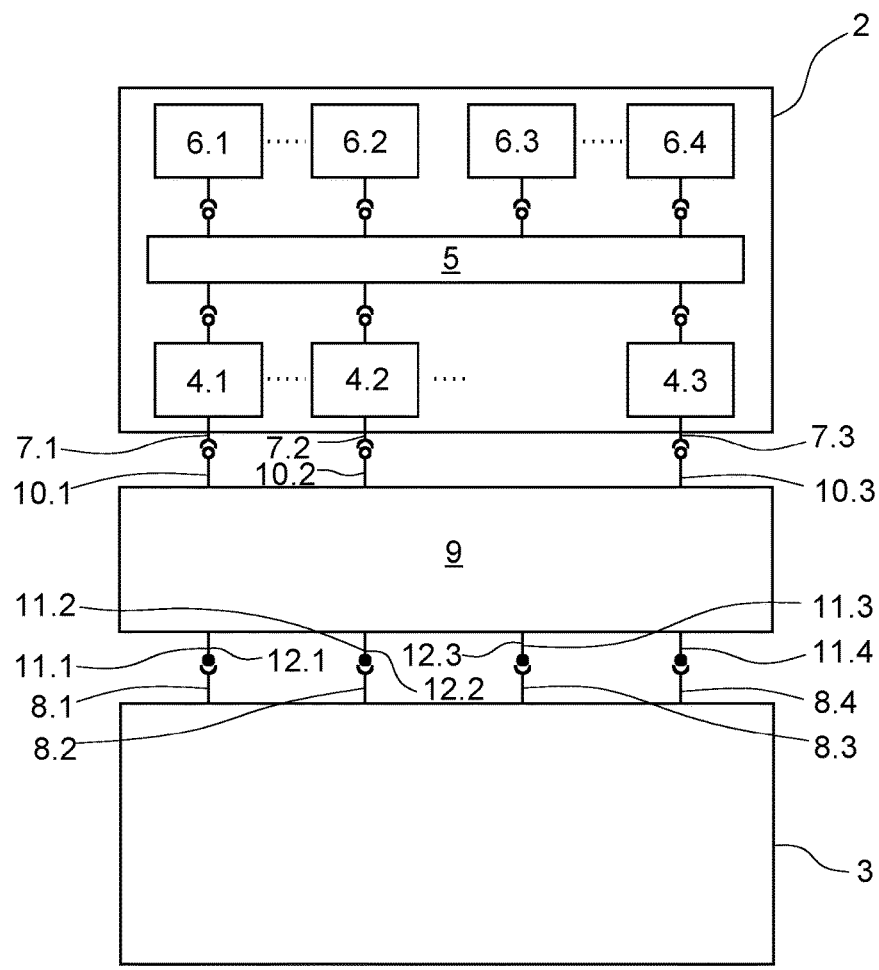
FIG. 5 shows an exemplary embodiment for a test device according to the invention with a virtual electronic control unit pin module.

In the exemplary embodiment shown in FIG. 5, the simulation environment interface 11 of the virtual electronic control unit pin module 9 is formed of virtual electronic control unit pins 12, so that only virtual physical control unit signals are transmitted through the data interface 8 of the simulation environment 3. This is advantageous because the simulation environment 3 is thus completely independent of changes in the modeling of the virtual electronic control unit 2. The simulation environment 3 structured as shown in FIG. 5 can be used practically unchanged in a simulator when the virtual electronic control unit 2 is replaced by a real control unit, because the simulation environment 3 is already configured for the pins of the physical interface of the real control unit. Of course, suitable I/O functionality must still also be set up in the simulator so that the pins of the physical interface of the real control unit can also be communicated with, but in functional terms nothing needs to be changed in the simulation environment 3.

The simulation environment 3 shown in FIG. 5 can be used during the entire controller development process, regardless of the closeness to the hardware—which may vary—of the modeling of the virtual electronic control unit 2. The adaptations necessitated by the changes in the modeling of the virtual electronic control unit 2 are undertaken in the virtual electronic control unit pin module 9. Even though the virtual electronic control unit pin module 9 must be adapted, the solution shown in FIG. 5 is still advantageous, since the simulation environment 3 can still be used in every case when transitioning from the virtual test to the real test in an HIL simulator, something which would not otherwise be possible.

Figure 6A:
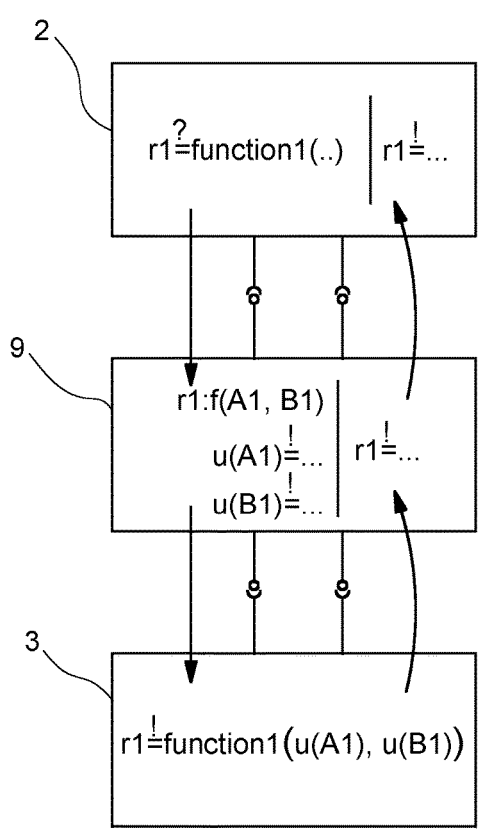
FIGS. 6a and 6b show a representation of the implementation of the data exchange between the virtual electronic control unit, the virtual electronic control unit pin module, and the simulation environment.
Figure 6B:
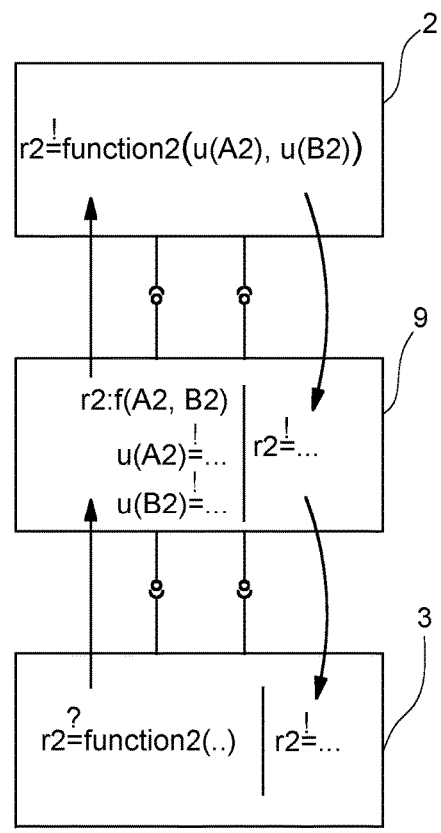

FIGS. 6a and 6b show ways in which it is possible to implement the data exchange through the relevant interfaces between the virtual electronic control unit 2, the virtual electronic control unit pin module 9, and the simulation environment 3, in particular for the case in which virtual electronic control unit pins 12 are used as a supplementary interface of the simulation environment 3. FIG. 6a shows that the virtual electronic control unit 2 requests a datum r1 from an interface of the simulation environment 3, here by means of a function call. The virtual electronic control unit pin module 9 accepts the function call and accesses a correspondence r1:f(A1, B1) that is stored in the virtual electronic control unit pin module 9. What is involved here is a correspondence between a datum r1 that can be exchanged between the virtual electronic control unit 2 and/or the virtual electronic control unit pin module 9 and/or the simulation environment 3 on the one hand, and the virtual electronic control unit pin A1, B1 that stands in relationship with the determination of this exchangeable datum on the other hand. For the virtual electronic control unit pins A1, B1 included in the correspondence, a rule for determining the associated virtual physical control unit signals u(A1), u(B1) is also stored in the virtual electronic control unit pin module 9, so that these virtual physical control unit signals u(A1), u(B1) can be determined. Consequently, the electrical signal values of the virtual electronic control unit pins A1, B1 of the simulation environment 3 are available in practice. Other tools, such as experimental and test automation tools, for example, can also use the virtual physical control unit signals u(A1), u(B1) independently of their use in the simulation environment 3. The function 1 required for calculating the datum r1 is then invoked by the virtual electronic control unit pin module 9 in the simulation environment 3, by which means the datum r1 is calculated, returned to the virtual electronic control unit pin module 9, and is forwarded from there to the virtual electronic control unit 2. In another exemplary embodiment, the test device is characterized in that, for the virtual electronic control unit pins 12 included in the correspondence r1:f(A1, B1), a rule for determining the datum r1 from the associated virtual physical control unit signals u(A1), u(B1) is also stored in the virtual electronic control unit pin module 9. Provision is made for this case in particular that the rule for determining the datum r1 from the associated virtual physical control unit signals u(A1), u(B1) evaluates time-dependent control signals, in particular in the form of a time-limited time signal or a time signal that is not limited in time.

In another exemplary embodiment, the direct return of a result (here: r1) can be omitted, so that a return either does not take place at all, or takes place only through the same or different virtual physical control unit signals.

In another exemplary embodiment, the virtual electronic control unit pins for the aforementioned functionality are used as the sole interface to the simulation environment rather than as a supplementary interface. In this case, the reaction of the simulation environment (e.g., executing a function functional) results solely from the changes in the virtual physical control unit signals (u(A1) and/or u(B1) in the example shown).

The opposite information flow is shown in FIG. 6b, which this time is initiated by the simulation environment 3. The process is analogous to the process in FIG. 6a; to avoid confusion, the identifiers A2, B2 are used for the virtual electronic control unit pins and function 2 is used for the required function call.

The variant embodiments discussed with reference to FIG. 6a also apply correspondingly for the reverse direction with reference to FIG. 6b.

In the case of the test devices shown in FIGS. 6a, 6b, a dedicated datum is exchanged between the virtual electronic control unit 2, the virtual electronic control unit pin module 9, and the simulation environment 3. In another exemplary embodiment, it is possible that the rule for determining the associated virtual physical control unit signals u(A1), u(B1) is a time-dependent function that serves to determine a time-dependent virtual physical time signal. Typical time-dependent signals can be present in the form of a dedicated parameterized waveform (a "signal pattern"), for example, or a parameterized modulated signal (e.g., a PWM signal). Preferably, the determination rule is an explicit determination rule in the virtual electronic control unit pin module 9. In other preferred exemplary embodiments, the determination rule is a reference to at least one determination rule of the virtual electronic control unit and/or at least one reference to at least one determination rule of the simulation environment.

In the case of FIG. 6a, the correspondence and the rule for determining the virtual physical control unit signals u(A1), u(B1) have been loaded into the virtual electronic control unit pin module 9 through external information. In another exemplary embodiment that is not illustrated here, the test device offers the user an input option for storing such information, something which is not discussed here in detail.

The virtual electronic control unit pin module 9 of the applicable test device 1 shown is designed such that it is suitable for code generation, namely for generating code that is suitable for programming implementation of the above-described functionalities. What is involved here in particular is code for connecting the external data interface 7 and/or the data interface 8 in terms of data. Alternatively or in addition, it is code for producing the correspondence between a datum r1 that can be exchanged between the virtual electronic control unit 2 and/or the virtual electronic control unit pin module 9 and/or the simulation environment 3 on the one hand, and the virtual electronic control unit pin A1, B1 that stands in relationship with the determination of this exchangeable datum r1 on the other hand. Furthermore, it is alternatively, or in addition, code for implementing a determination rule and/or calculation rule for determining the associated virtual physical control unit signals u(A1), u(B1) and/or code for implementing a time-dependent virtual physical time signal as the virtual physical control unit signal u(A1), u(B1) and/or code for implementing a determination rule for determining the exchangeable datum r1 from the associated virtual physical control unit signals u(A1), u(B1).

Finally, the code generated by the virtual electronic control unit pin module 9 can be executed together with the code of the virtual electronic control unit 2 and the code of the simulation environment 3 in a common simulation, wherein the simulation is, in particular, a real-time simulation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A test device for testing at least a portion of a virtual electronic control unit with a simulation environment in a simulator, the test device having the virtual electronic control unit and the simulation environment, the virtual electronic control unit comprises at least one software component with at least one external data interface, the simulation environment comprises at least one data interface for at least indirect data exchange with the virtual electronic control unit, comprising:

a virtual electronic control unit pin module having at least one virtual electronic control unit interface and is connected via the virtual electronic control unit interface at least to the external data interface of the software component of the virtual electronic control unit;

at least one simulation environment interface provided in the virtual electronic control unit pin module that is connected by the simulation environment interface to the data interface of the simulation environment; and at least one virtual electronic control unit pin provided in the virtual electronic control unit pin module and that corresponds to a pin of the physical interface of a real control unit to be simulated, wherein a virtual physical control unit signal is transmittable through the virtual electronic control unit pin.

2. The test device according to claim 1, wherein the simulation environment interface of the virtual electronic control unit pin module has at least one virtual electronic control unit pin so that virtual physical control unit signals are transmittable through the data interface of the simulation environment.

3. The test device according to claim 1, wherein the simulation environment interface of the virtual electronic control unit pin module is composed entirely of virtual electronic control unit pins so that exclusively virtual physical control unit signals are transmittable through the data interface of the simulation environment.

4. The test device according to claim 1, wherein the simulation environment interface of the virtual electronic control unit pin module has no virtual electronic control unit pins so that the virtual electronic control unit pin module establishes a direct connection between the virtual electronic control unit and the simulation environment, and wherein the virtual electronic control unit pin module has the at least one virtual electronic control unit pin outside the simulation environment interface.

5. The test device according to claim 1, wherein the virtual electronic control unit pin module has at least one correspondence between a datum that is exchanged between the virtual electronic control unit and/or the virtual electronic control unit pin module and/or the simulation environment on the one hand, and the virtual electronic control unit pin that stands in relationship with the determination of this exchangeable datum on the other hand.

6. The test device according to claim 5, wherein for each of the virtual electronic control unit pins included in the correspondence, a rule for determining the associated virtual physical control unit signals and/or a rule for determining the datum from the associated virtual physical control unit signals is also stored in the virtual electronic control unit pin module.

7. The test device according to claim 6, wherein the rule for determining the associated virtual physical control unit signals is a time-dependent function and serves to determine a time-dependent virtual physical time signal in the form of a time-limited time signal or a time signal that is not limited in time.

8. The test device according to claim 6, wherein the rule for determining the datum from the associated virtual physical control unit signals evaluates time-dependent control signals in the form of a time-limited time signal or a time signal that is not limited in time.

9. The test device according to claim 6, wherein the determination rule is an explicit calculation rule in the virtual electronic control unit pin module and/or has at least one reference to at least one calculation rule of the virtual electronic control unit and/or has at least one reference to at least one calculation rule of the simulation environment.

10. The test device according to claim 1, wherein the characteristics of the virtual physical control unit signals are specified in the virtual electronic control unit pin module.

11. The test device according to claim 1, wherein code is generated in the virtual electronic control unit pin module for connecting the external data interface and/or the data interface and/or for producing the correspondence between a datum that is exchanged between the virtual electronic control unit and/or the virtual electronic control unit pin module and/or the simulation environment on the one hand, and the virtual electronic control unit pin that stands in relationship with the determination of this exchangeable datum on the other hand and/or for implementing a determination rule and/or calculation rule for determining the associated virtual physical control unit signals and/or for implementing a time-dependent virtual physical time signal as the virtual physical control unit signals and/or for implementing a determination rule for determining the exchangeable datum from the associated virtual physical control unit signals.

12. The test device according to claim 11, wherein the code of the virtual electronic control unit, the code of the simulation environment, and the code generated by the virtual electronic control unit pin module are executed in a common simulation, and wherein the simulation is a real-time simulation.

13. A virtual electronic control unit pin module for virtual representation of a pin-related physical interface of a real control unit that is to be simulated, the virtual electronic control unit pin module comprising:
- at least one virtual electronic control unit interface;
- at least one simulation environment interface; and
- at least one virtual electronic control unit pin,
- wherein a data connection to at least one external interface of a software component of a virtual electronic control unit is established via the virtual electronic control unit interface,
- wherein at least one data connection to the data interface of a simulation environment is established with the simulation environment interface,
- wherein the virtual electronic control unit pin corresponds to a pin of the physical interface of a real control unit that is to be simulated, and
- wherein a virtual physical control unit signal is transmitted through the virtual electronic control unit pin.

* * * * *